(12) United States Patent
Khan et al.

(10) Patent No.: US 6,351,352 B1
(45) Date of Patent: Feb. 26, 2002

(54) SEPARABLY BONDABLE SHUNT FOR WIRELESS SUSPENSIONS

(75) Inventors: Amanullah Khan; Warren Coon, both of Temecula, CA (US)

(73) Assignee: Magnecomp Corp., Temecula, CA (US)

( * ) Notice: Subject to any disclaimer, the term of this patent is extended or adjusted under 35 U.S.C. 154(b) by 0 days.

(21) Appl. No.: 09/349,413

(22) Filed: Jul. 6, 1999

Related U.S. Application Data

(60) Provisional application No. 60/137,044, filed on Jun. 1, 1999.

(51) Int. Cl.[7] .............................. G11B 5/54; G11B 5/012
(52) U.S. Cl. .................................. 360/264.2; 360/245.9
(58) Field of Search ............................ 360/264.2, 266.3, 360/245.8, 245.9, 246

(56) References Cited

U.S. PATENT DOCUMENTS 5,844,751 A * 12/1998 Bennin et al. ............... 360/104
5,969,901 A * 10/1999 Eckberg et al. ........... 360/97.01
6,146,813 A * 11/2000 Girard ........................ 430/319

* cited by examiner

*Primary Examiner*—George J. Letscher
(74) *Attorney, Agent, or Firm*—Louis L. Bachand

(57) ABSTRACT

The invention provides continuing shunt protection of wireless suspension assemblies with a shunt structure that is readily attached to and detached from the contact pads or other exposed areas of the conductive traces of the flexible conductive laminate portion of the wireless suspension for use as needed to protect the MR and GMR elements/heads. The shunt structure comprises a conductive web to connect the conductive traces in parallel, and adhesive allowing the separable attachment of the web to the traces. The metal or metal deposited conductive web has varying geometries of conductive areas and adhesive areas to allow conductive web attachment to the proximate contact pads of the suspension, to be removed during testing and left on during assembly and between tests to nearly continually protect the head magnetoresistive element, or, to provide continuous ESD protection for the MR and GMR element attached to a flexible conductive circuit, to allow conductive web attachment to the traces beyond the contact pads such that the web is left in place during suspension assembly, during testing and between tests.

20 Claims, 8 Drawing Sheets

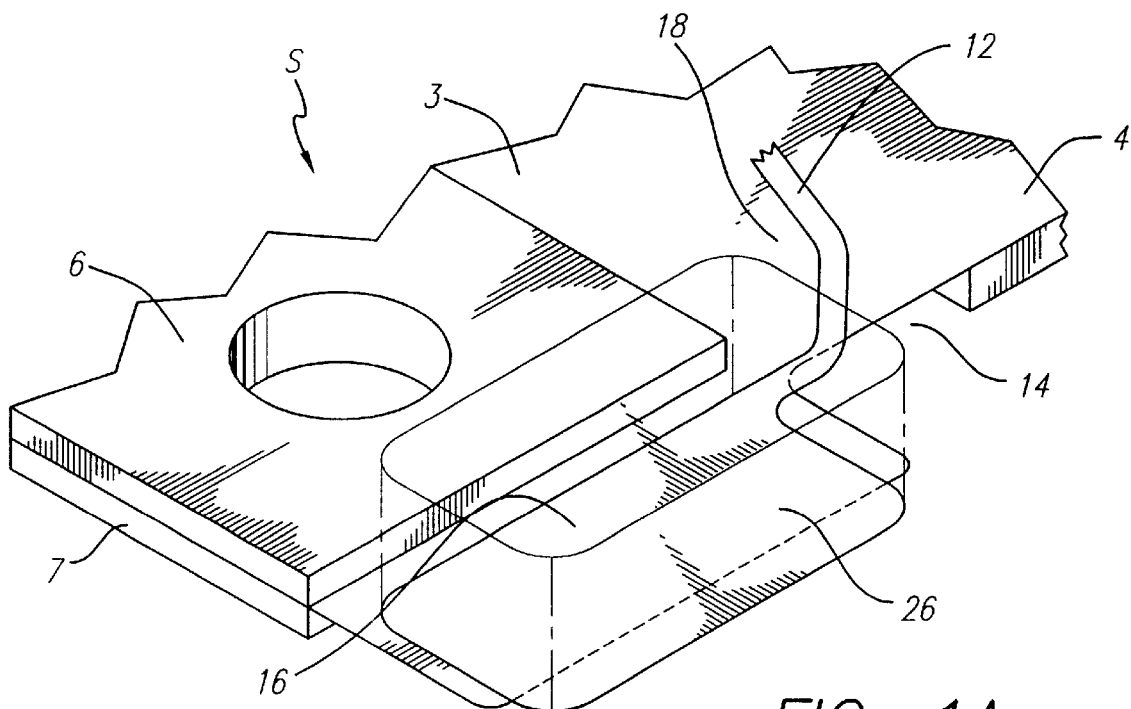
FIG. 1A
FIG. 1B
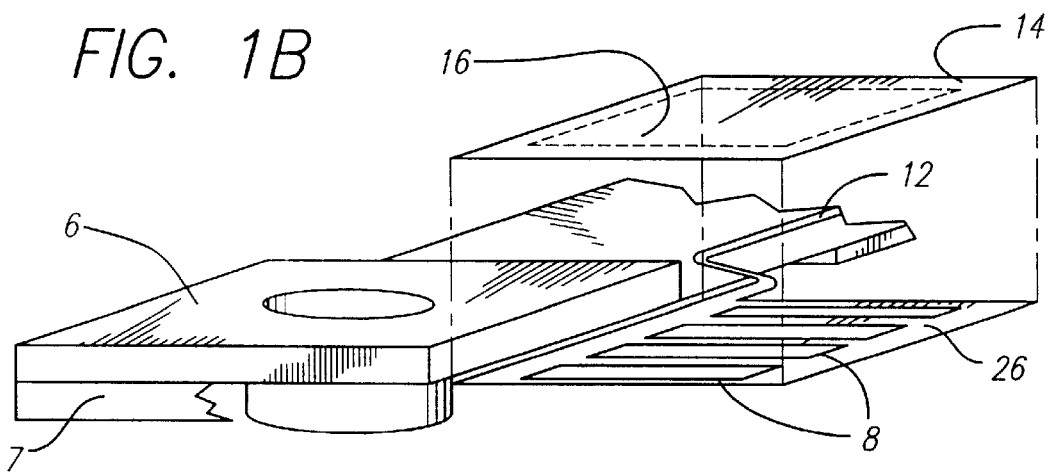

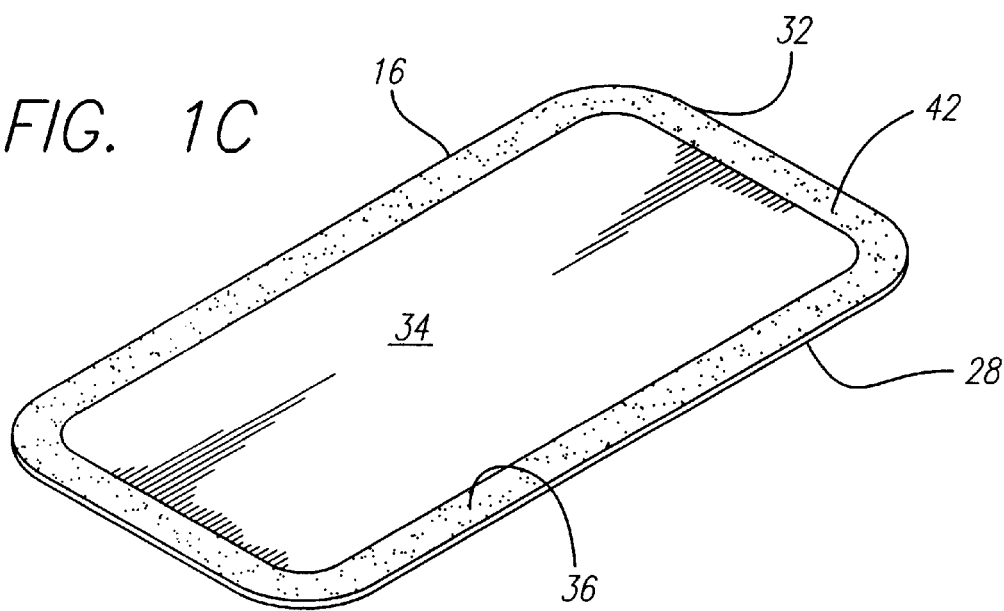
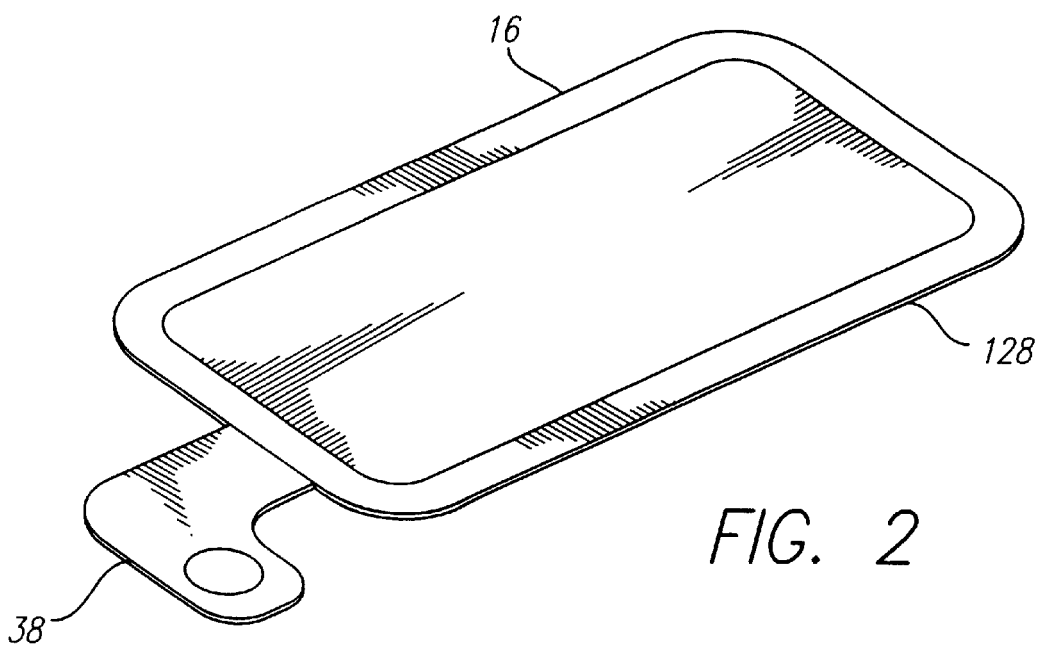

FIG. 4
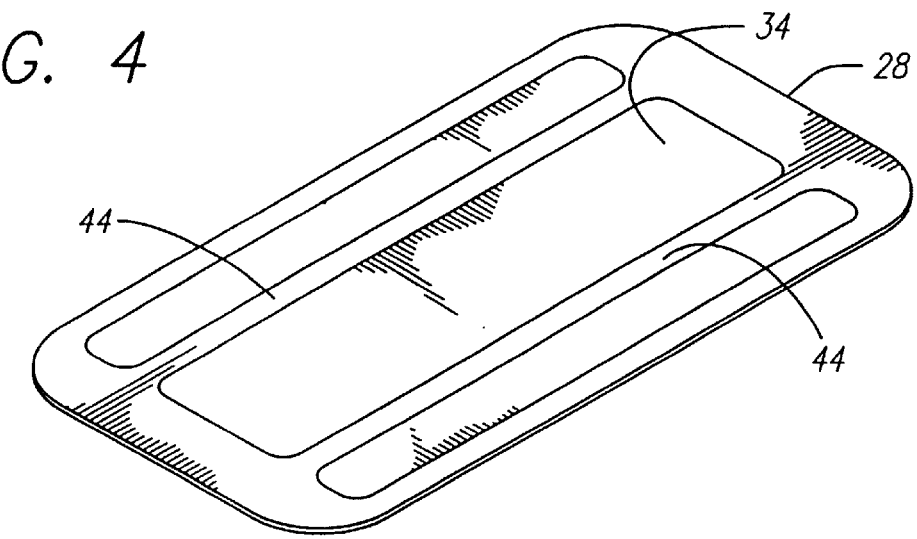
FIG. 5A
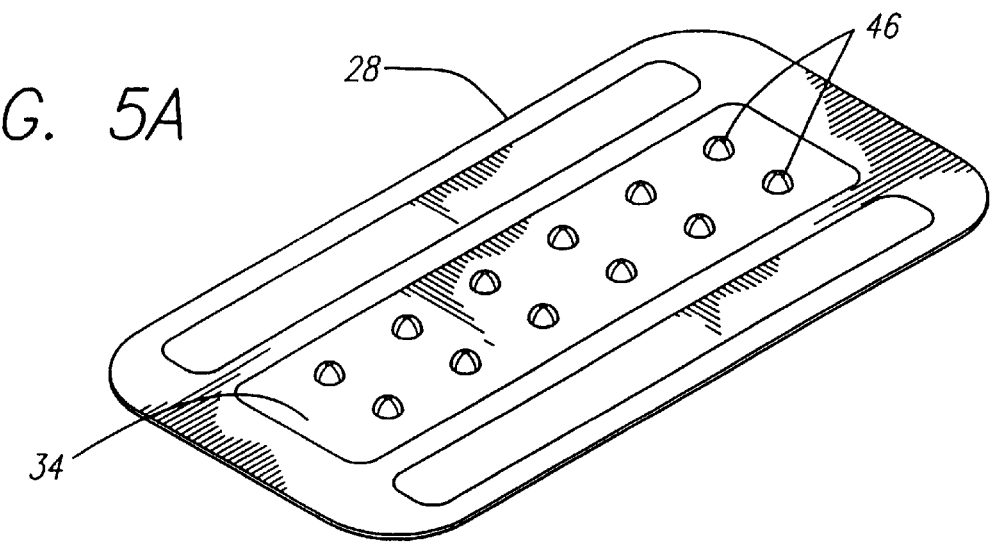
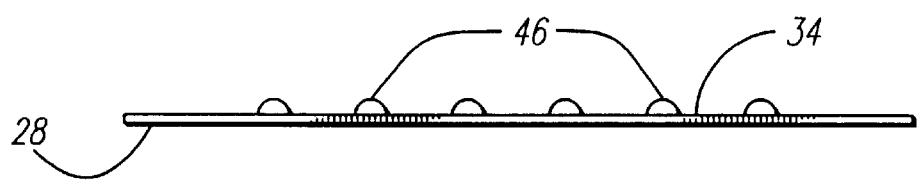
FIG. 5B

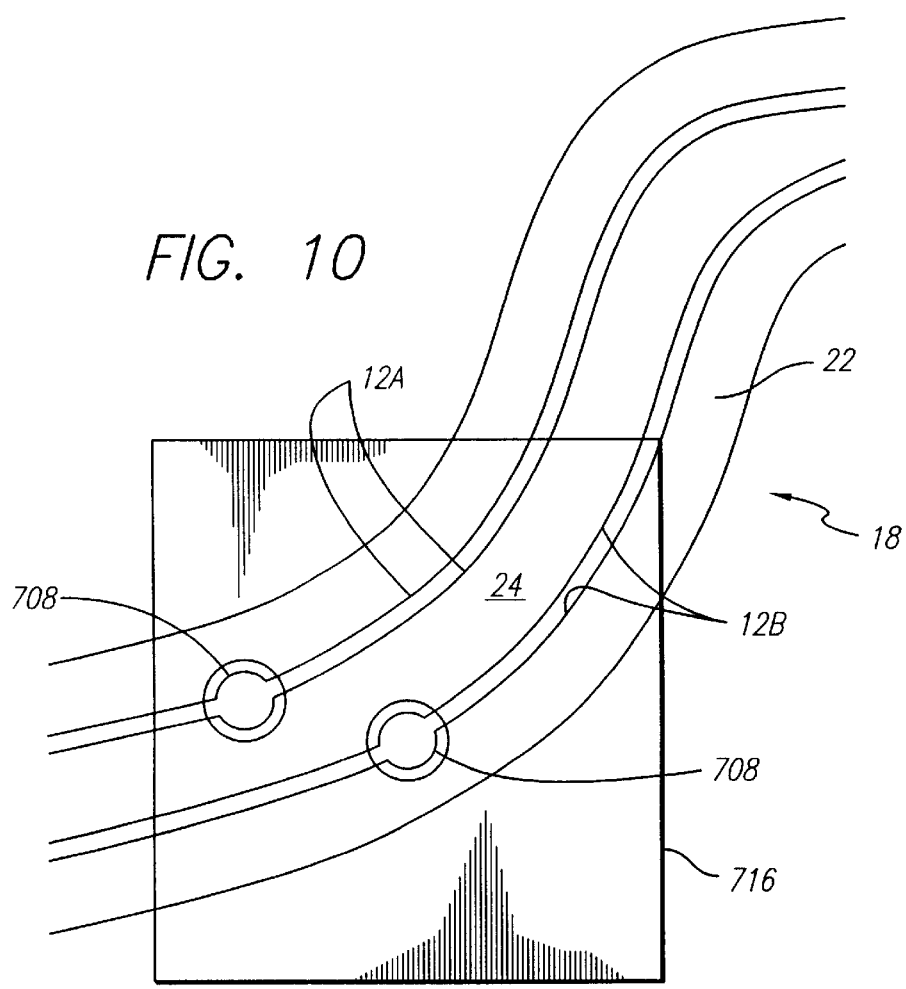
FIG. 10
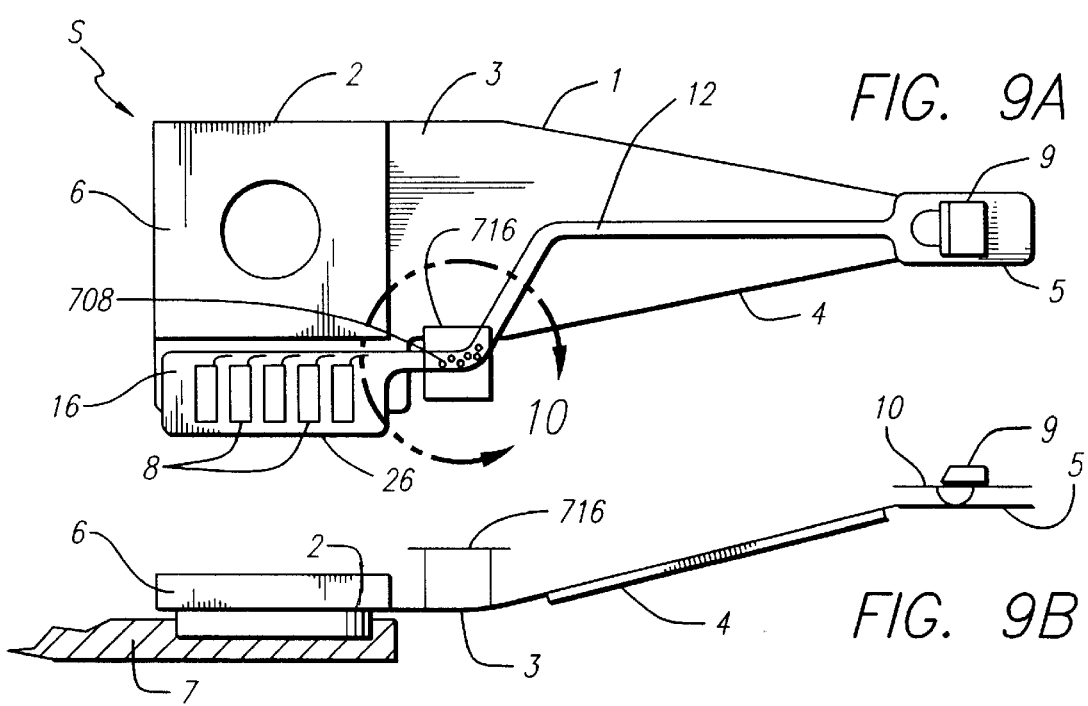
FIG. 9A
FIG. 9B

SEPARABLY BONDABLE SHUNT FOR WIRELESS SUSPENSIONS

REFERENCE TO RELATED APPLICATION

This application claims the benefit of U.S. Provisional Application Ser. No. 60/137,044, filed Jun. 1, 1999.

BACKGROUND OF THE INVENTION

1. Field of the Invention

This invention relates to disk drive suspensions, and more particularly to wireless disk drive suspension assemblies having a flexible conductive laminate forming the electrical connection between the slider, including the disk read element/head, and the suspension signal electronics. In a particular aspect, the invention provides an improved shunt for protecting the read head during suspension assembly operations. The shunt structure is reusable and comprises a conductive material having a resealable adhesive. The shunt structure connects the flexible conductive laminate leads so as to redirect electrostatic discharge currents away from the read head. In a further aspect, the shunt structure may be attached to the proximate contact pads between test operations, or to new contact areas especially designed to take advantage of the invention by remaining attached both between and during testing operations.

2. Related Art

One of the major problems with wireless suspensions is the occurrence of spontaneous electrostatic discharges (ESD) through them when they are connected to magnetoresistive (MR) disk read elements/heads or giant magnetoresistive (GMR) element/heads. Any external charge poses a risk of traveling to the MR or GMR element. Thus a charge from a person or from an insulating surface charge build-up can flow via the trace/wire leads (or pads) to the slider/head and damage the MR sensor element, sometimes melting the sensor element. It takes as little as 15 volts for a GMR head to be damaged. One of the ways to prevent this phenomenon is to connect all the leads in parallel so that this current does not pass through the MR element. Designing a circuit with a shunt across the leads before the head is attached to the suspension will connect the leads in parallel. But, this solution only is effective when the assembly of the wireless conductor and MR or GMR is in other than a test or operating condition. In a test or operating situation, after the head/element is attached to the conductors/traces to be tested for reading and writing to disk, the presence of the shunt circuitry prevents testing and the shunt needs to be removed. The shunt is cut-off from the remainder of the circuit and it cannot be reattached; electrostatic discharge protection no longer exists for the affected part although more handling and testing is required.

SUMMARY OF THE INVENTION

It is an object of the invention to provide method and apparatus for continuing shunt protection of wireless suspension assemblies. It is another object to provide a novel shunt structure that is readily attached to and detached from the contact pads or other exposed areas of the conductive traces of the flexible conductive laminate portion of the wireless suspension for use as needed to protect the MR and GMR elements/heads. It is a further object to provide a conductive web that will connect the conductive traces in parallel, and adhesive allowing the separable attachment of the web to the traces. It is a still further object to provide a metal or metal deposited conductive web with varying geometries of conductive areas and adhesive areas. Yet another object is to provide conductive web attachment to the proximate contact pads of the suspension, to be removed during testing and left on during assembly and between tests to nearly continually protect the head magnetoresistive element. A further object is to provide continuous ESD protection for the MR and GMR element attached to a flexible conductive circuit by providing conductive web attachment to the traces beyond the contact pads such that the web is left in place during suspension assembly, during testing and between tests.

These and other objects of the invention to become apparent hereinafter are realized in the method of protecting a disk read head from spontaneous electrostatic discharge current during the assembly but not during the actual testing operations of a disk drive suspension comprising a load beam and a flexible conductive laminate, the laminate having at least one pair of trace conductors connected to the magnetoresistive read head, including exposing adjacent portions of the trace conductors comprising each conductor pair, and applying to the exposed trace conductor portions a separably adherent shunt structure to temporarily connect each the pair of trace conductors in parallel while there is a potential for a spontaneous electrostatic discharge current reaching the disk read head, such that the discharge currents are directed away from the head.

In an alternative embodiment, the invention provides the method of protecting a disk read head from spontaneous electrostatic discharge current during the assembly and during actual testing operations of a disk drive suspension comprising a load beam having a base and a flexible conductive laminate, the laminate having at least one pair trace conductors connected to the disk read head and to a first series of contact pads adjacent the load beam base useful for attaching test leads, including maintaining a second series of contact pads electrically connected to the trace conductors between the first series of contact pads and the disk read head and exposed, and applying to the second series of contact pads a shunt structure separably adherent to the laminate and connecting the trace conductors in parallel through the second series of contact pads during assembly and testing of the suspension with test leads attached to the first series of contact pads and there is a potential for a spontaneous electrostatic discharge current reaching the disk read head, such that the discharge currents are directed away from the disk read head.

In these and like embodiments, typically, the method further includes forming the flexible conductive laminate from a dielectric plastic layer and one or more pairs of conductive traces supported by the dielectric plastic layer in insulated relation, forming the flexible conductive laminate from a base metal layer, a dielectric plastic layer and one or more pairs of conductive traces supported by the metal base layer and the dielectric plastic layer in insulated relation, forming the shunt structure from a conductive web and an adhesive bonded to the web and separably bondable to the laminate with the conductive web in conducting relation with the trace conductor portions, selecting as the conductive web a conductive metal sheet, selecting as the conductive metal sheet a flexible sheet of copper, silver or gold, distributing the adhesive across the web in separate, discrete quantities, forming the adhesive into separated flat spots of adhesive for separably adhering the web to the laminate, forming the adhesive into separated dimples of adhesive for separably adhering the web to the laminate, selecting as the conductive web a nonconductive plastic sheet material having a conductive deposit of metal thereon, forming the conductive metal deposit with raised portions for trace conductor contact, locating the conductive metal deposit in a predetermined location on the plastic sheet material, and forming areas of adhesive adjacent the metal deposit for separably bonding the sheet material to the laminate with its conductive metal deposit in shunting conductive contact with the exposed trace conductor portions, defining discrete dimples of adhesive across the conductive metal deposit for separably adhering the sheet to the laminate, defining flat spots of adhesive across the conductive metal for separably adhering the sheet to the laminate, forming the shunt structure from a nonconductive web, a conductor material distributively disposed on the web, and an adhesive separably bondable to the laminate with the conductor material in conducting contact with the trace conductor portions, selecting as the nonconductive web a plastic sheet material, distributing the conductor material in a pattern across the plastic sheet material web and distributing the adhesive in a further pattern across the plastic sheet material web for adhering the web to the laminate, defining a grid of conductor metal, attaching the conductor metal grid to the plastic sheet material, and arranging the adhesive to separably bond the web to the laminate between the elements of the grid, the grid elements electrically contacting the trace conductor portions, defining a three dimensional sheet of conductive material, attaching the conductive material sheet to the plastic sheet material, and arranging the adhesive to separably bond the web to the laminate with the conductive material sheet in electrical contact with the trace conductor portions, and/or defining a distributed series of raised areas on the conductive material sheet to provide the material the third dimension, the raised areas being arranged to make electrical contact with the trace conductor portions.

The method also further typically includes selecting as the conductive web a nonconductive plastic sheet material having a conductive deposit of metal thereon, forming the conductive metal deposit with raised portions for trace conductor contact through the second series of contact pads, locating the conductive metal deposit in a predetermined location on the plastic sheet material, and forming areas of adhesive adjacent the metal deposit for separably bonding the sheet material to the laminate with its conductive metal deposit in shunting conductive contact with the exposed second series of contact pads, forming the shunt structure from a nonconductive web, a conductor material distributively disposed on the web, and an adhesive separably bondable to the laminate with the conductor material in conducting contact with the trace conductor portions through the second series of contact pads.

The invention apparatus comprises in one embodiment a disk drive suspension shunt structure for connecting in parallel a pair of trace conductors in a flexible conductive laminate connected to a disk read head, the trace conductors having exposed portions, the shunt structure comprising a flexible carrier, an adhesive carried on the carrier, the adhesive being separably adherent to the laminate, and a conductor material distributed across the carrier and relative to the adhesive such that the conductive element electrically connects in parallel the trace conductors at their exposed portions in the adhered condition of the carrier to the laminate.

In a further embodiment the invention provides a disk drive suspension comprising a load beam, a disk read head, a flexible conductive laminate comprising a plastic layer containing conductive traces electrically connected to the head in a manner potentially subjecting the head to spontaneous electrostatic discharge currents deleterious to the head, the trace conductors having adjacent exposed portions, and a shunt structure comprising a web adapted and arranged to electrically connect the laminate conductive traces at their the exposed portions, and an adhesive on the web separably bonding the shunt structure to the laminate in electrically connected relation with the conductive traces, whereby the discharge currents are directed away from the disk read head.

In these and like embodiments, typically, the flexible conductive laminate comprises a dielectric plastic layer and one or more pairs of conductive traces supported by the dielectric plastic layer in insulated relation, the flexible conductive laminate comprises a base metal layer, a dielectric plastic layer and one or more pairs of conductive traces supported by the metal base layer and the dielectric plastic layer in insulated relation, the shunt structure web comprises a conductive metal sheet, the conductive metal sheet comprises a flexible sheet of copper, silver or gold, the adhesive is distributed across the web in separate, discrete quantities, the adhesive is formed into separated flat spots for separably adhering the web to the laminate, the adhesive is formed into separated dimples of adhesive for separably adhering the web to the laminate, the web comprises a nonconductive plastic sheet material having a conductive deposit of metal thereon, the conductive metal deposit is formed with raised portions for trace conductor contact, the conductive metal deposit is located in a predetermined location on the plastic sheet material, and in which areas of adhesive are formed adjacent the metal deposit for separably bonding the sheet material to the laminate with its conductive metal deposit in shunting conductive contact with the exposed trace conductor portions, the adhesive is formed into discrete dimples distributed across the conductive metal deposit for separably adhering the sheet to the laminate, the adhesive is formed into flat spots across the conductive metal deposit for separably adhering the sheet to the laminate, the shunt structure web comprises nonconductive sheet material, a conductor material distributively disposed on the web nonconductive sheet material, and an adhesive separably bondable to the laminate with the conductor material in conducting contact with the trace conductor portions, the nonconductive web comprises a plastic sheet material, the conductor material is distributed in a pattern across the plastic sheet material web and the adhesive is distributed in a further pattern across the plastic sheet material web for adhering the web to the laminate, the conductor material comprises a grid of conductor metal, the conductor metal grid being attached to the plastic sheet material, and the adhesive being arranged to separably bond the web to the laminate between the elements of the grid, the grid elements being in electrical contact with the trace conductor portions, the conductive material comprises a three dimensional sheet, the conductive material sheet being attached to the plastic sheet material, and the adhesive being arranged to separably bond the web to the laminate with the conductive material sheet in electrical contact with the trace conductor portions, and forming a distributed series of raised areas on the conductive material sheet to provide the material sheet its the third dimension, the raised areas being arranged to make electrical contact with the trace conductor portions.

In a further embodiment, the invention provides a disk drive suspension having a disk read head protected from spontaneous electrostatic discharge current during the assembly and testing of the disk drive suspension, the suspension comprising a load beam having a base and a flexible conductive laminate, the laminate having at least one pair trace conductors connected to the disk read head and to a first series of contact pads adjacent the load beam base useful for attaching test leads, a second series of contact pads electrically connected to the trace conductors between the first series of contact pads and the disk read head and exposed, and applied to the second series of contact pads a shunt structure separably adherent to the laminate, the shunt structure connecting the trace conductors in parallel through the second series of contact pads during assembly and testing of the suspension.

In this and like embodiments, typically, the shunt structure is formed from a conductive web and an adhesive bonded to the web and separably bondable to the laminate with the conductive web in conducting relation with the trace conductor portions through the second series of contact pads, and the conductive web comprises a nonconductive plastic sheet material having a conductive deposit of metal thereon.

BRIEF DESCRIPTION OF THE DRAWINGS

The invention will be further described in conjunction with the attached drawings in which:

FIG. 1A is an oblique fragmentary view of a disk drive suspension having the shunt structure of the invention;

FIG. 1B is a perspective view thereof;

FIG. 1C is an oblique view of the invention shunt structure;

FIG. 2 is an oblique view of an alternate form of shunt structure;

FIG. 4 is an oblique view of an alternate form of shunt structure;

FIG. 5A is an oblique view of an alternate form of shunt structure;

FIG. 5B is an end elevation view of the shunt structure shown in FIG. 5A;

FIG. 9A is a plan view of an alternate form of the invention;

FIG. 9B is a side elevation view thereof;

FIG. 10 is a view taken on line 10 in FIG. 9A.

DETAILED DESCRIPTION

Figure 3A:
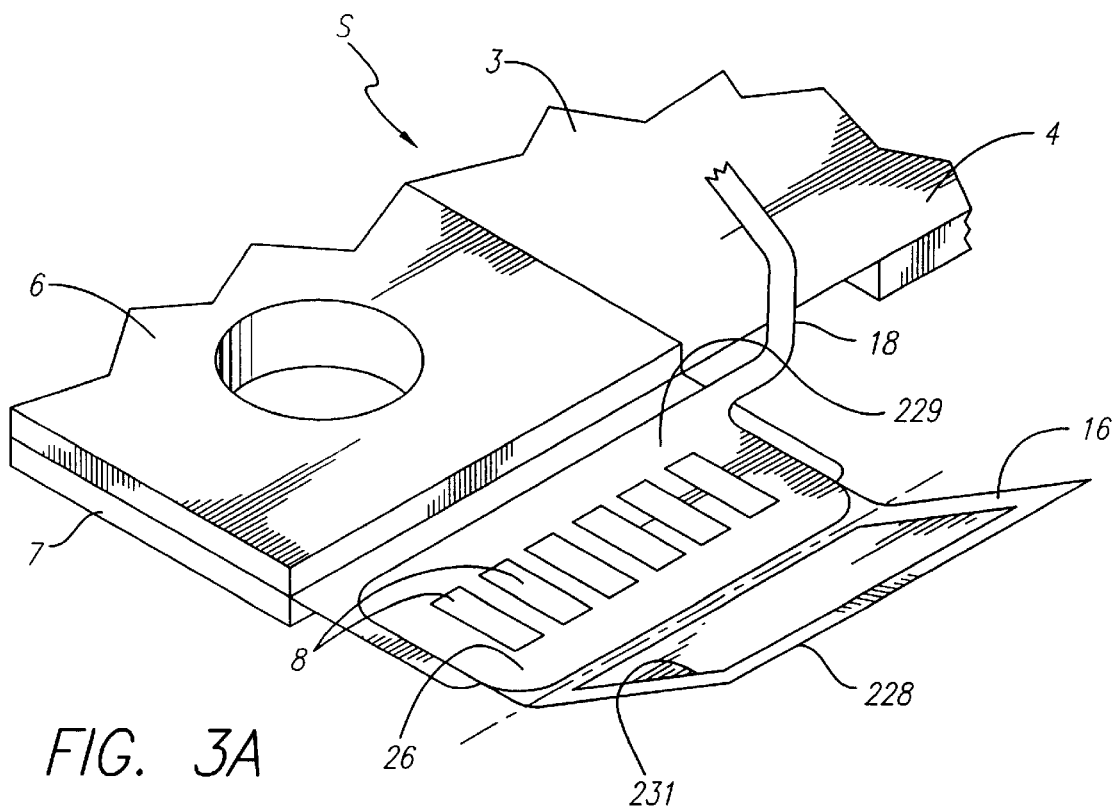
FIG. 3A is an oblique fragmentary view of the disk drive suspension having the shunt structure separated from the contact pads.

In the assembly of a disk drive suspension comprising a load beam and a conductor attached to a slider, the disk read head or read/write element (sometimes referred to herein as the slider after the encasing body) is attached to the suspension load beam flexure tongue with solder or adhesive. Then electrical connections between the head and leads are established by either ultrasonically bonding the leads to the read/write head pads or bonding the pads from the lead and the head using a gold ball (pressure and heat). At this stage, the leads are shorted using an integrally formed shunt. Then the head is tested number of times to determine its electrical performances. To do this, even before the first test the shunt must be sheared off at head gimbal assembly (HGA) level. This is an irreversible step and one that exposes the copper traces. Until the shearing operation the copper was completely covered by either solder mask, solder, or gold planting so that the reactive copper was protected.

To protect the leads use has been made of a clip, sometimes referred to as a "crow bar", to shunt the leads together. In operation, the clip is similar to a paper clip. Disadvantages of its use excessive bulk, a penchant for damaging the contact pads during clamping, changing or even damaging the suspension from its own weight (pendulum effect), and likelihood of snagging on something during handling.

In the present invention, the advantages of a shunt are realized without the noted difficulties. A web that can be simply an adhesive tape with conductive material attached to it is applied to the bond pads of the leads (the free end of the trace/wireless interconnect.) as a conductor effective to shunt the leads. A typical shunt structure will be a conductive film with an electrical conductivity of approximately 1000 ohms cm per square. Bond pads, contact pads and like structures referred to herein are separate conductive structures to which the leads are attached, or can be portions of the leads themselves. The terms pad or contact pad thus refer to both exposed, noninsulated portions of the trace conductors and to structures separate from the flexible conductive laminate, carried on the load beam for example, used to effect an electrical connection between a trace conductor and other device electronics. The shunt structure is built with light, flexible material with a conductive adhesive so that it can be applied to the pads without clamps of any substantial force likely to damage the suspension. The shunt structure can be taken off by applying only a small force. A new shunt tape can be used after a test operation, or the old tape can be reused. The flexible conductive shunt pad replaces the original shunt that was not of continuing utility, and is an improvement over the clip-type, add-on shunt just described. Unlike the clip shunt, the invention shunt structure can be easily applied, and removed, during the testing, and reapplied. The shunt structure of the invention can have a projecting tab to facilitate manipulation. All the several variations mentioned above and described hereinafter, are an improvement over the prior art in greatly reducing or eliminating the time of exposure of the wireless conductor to conditions that may result in ESD damage.

Complete elimination of exposure time is possible with an alternate form of the invention that reduces the time of exposure to ESD conditions to zero. Before the invention the total exposure time is the sum of time after the first test operation through to installation of the head gimbal assembly HGA onto the head stack assembly HSA. This time period may amount to a few hours to a few weeks or more. In the first embodiment of the invention method the short times during the manufacturing process during which each part is loaded or unloaded onto each piece of electrical test equipment become the only times of systematic exposure, i.e., as an intended part of the manufacturing system assuming everything is done correctly according to the manufacturing process system. The time the shunt is in place abuts the time the tester connection is made or broken and there is a minimum time gap between the successive steps.

| The sequence is: | |
|---|---|
| Shunt in place | (part protected) |
| Remove shunt | (part unprotected) |
| Connect tested | (part protected) |
| Perform test | (part protected) |
| Disconnect tester | (part unprotected) |
| Replace shunt | (part protected) |

It is possible to make still further improvements by incorporation a second set of contact pads, as added structure or by exposing a portion of the trace conductors, into the trace design so that the shunt may be left in place while the electrical connections are being made. The time the shunt is in place includes the time the connections are made to the tester. For this embodiment of the invention the trace flexure circuit has an opening for each trace in the solder masks so that the traces can be exposed to contact and connected together by the invention shunt structure.

| The sequence becomes: | |
|---|---|
| Shunt in place | (part protected) |
| Connect tester | (part protected) |
| Remove shunt | (part protected) |
| Perform test | (part protected) |
| Replace shunt | (part protected) |
| Disconnect tester | (part protected) |

The part is completely protected against spontaneous electrical discharge.

Figure 8:
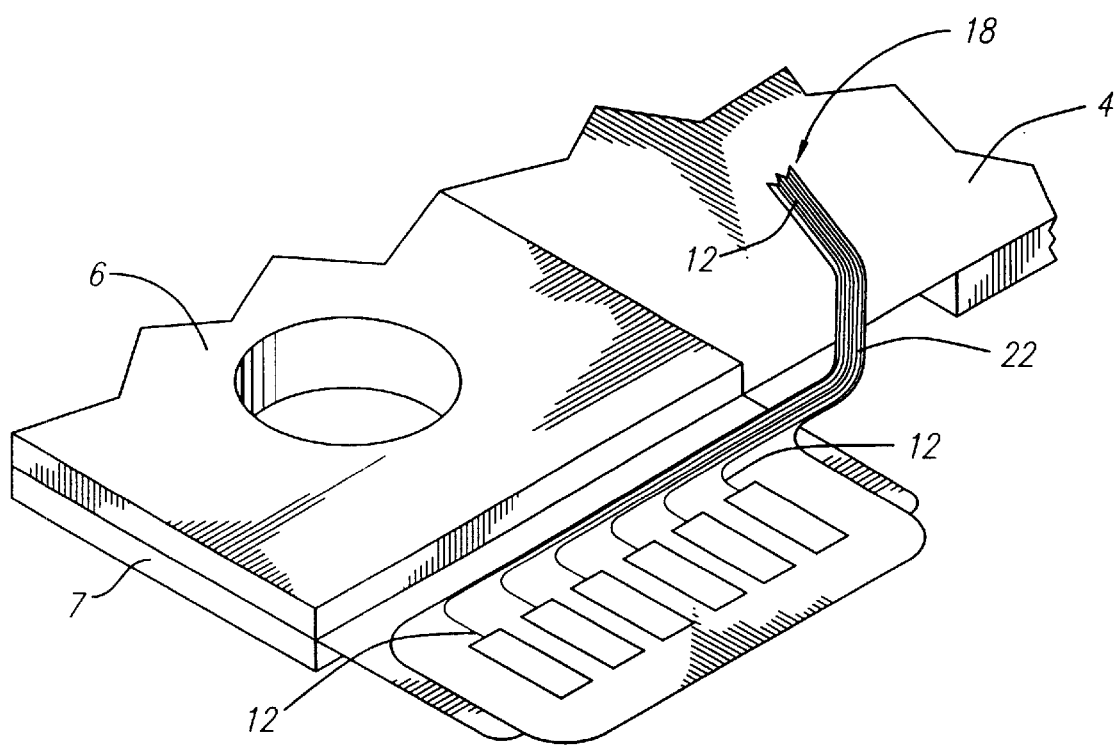
FIG. 8 is an oblique fragmentary view of a disk drive suspension before attachment of a shunt structure to the contact pads.

Turning now to the drawings, in FIGS. 9A and 9B the general environment of the invention is shown including a disk drive suspension S comprising a load beam 1, having a base portion 2, a spring portion 3, and a rigid portion 4 carrying a flexure 5. Mounting plate 6 secures the load beam 1 to an actuator arm 7. Electrical contact pads 8 connect the suspension electronics (not shown) to the slider 9 attached to flexure tongue 10 via trace conductors 12 extending between the slider and the contact pads. See FIG. 8.

With reference to FIGS. 1–8 and 10, the invention is particularly concerned with providing a shunt 14 across the electrical circuit including the contact pads 8 and the trace conductors 12. In a first embodiment of the invention shunt 14 comprises the shunt structure 16 for connecting in parallel at least one pair, and in general all pairs of the trace conductors 12. Trace conductors 12 typically comprise copper and are the conductive portions of the flexible laminate 18. Flexible conductive laminate 18 is known per se and typically comprises a dielectric layer 22 on which the trace conductors 12 are formed, the conductive traces being either deposited on the dielectric layer or constituting the remaining portions of a copper or other conductive layer that has been etched away, and a cover layer 24 and optionally a metal base layer (not shown) that is attached to the dielectric layer in spaced relation to the trace conductors, see FIG. 10.

In a typical assembly of a disk drive suspension S the flexible conductive laminate 18 is connected as described above and as so connected is potentially subject to spontaneous electrostatic discharge currents deleterious to the head within slider 9. To avoid this problem, in accordance with the first embodiment of the invention, the contact pads 8 are connected in parallel with the invention shunt structure 16 shown in FIGS. 1A and 1B juxtaposed with the contact pad 8 surrounding area 26. Shunt structure 16, shown in FIG., 1C, comprises a web 28 adapted and arranged to electrically connect the laminate conductive traces 12 in parallel by connecting their respective contact pads 8. Shunt structure web 28 is conductive, as hereinafter described, and has an adhesive 32 distributed thereon of a tacky nature suitable for separably bonding the shunt structure web to the contact pad area 26 around the contact pads 8 in electrically connected relation with the conductive traces 12, so that any electrostatic discharge currents will be directed away from the disk read head in slider 9.

With reference particularly to FIGS, 1C, and 4–7, the shunt structure web 28 comprises a conductive sheet 34 of conductive metal, such as a flexible sheet of copper, silver or gold, or a nonconductive plastic sheet material having a conductive deposit of metal thereon. The web-carried adhesive 32 is shown in FIG. 1C to be distributed at the perimetrical edge margin 36 of the sheet 34 in such manner that the adhesive does not touch the contact pads 8 but does attach or couple the web 28 to the area 26 surrounding the contact pads.

For convenience in handling the shunt structure 16, and with reference to FIG. 2, shunt structure web 128 has a tab 38 projecting from the main portion of the web for finger gripping to assist in the manipulation of the web onto and from the area 26.

Figure 3B:
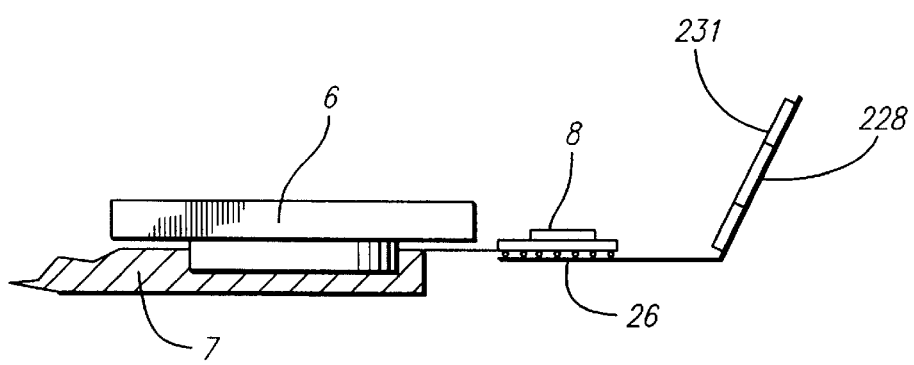
FIG. 3B is an end elevation view of the disk drive suspension shown in FIG. 3A.

In FIGS. 3A and 3B, shunt structure web 228 is shown in a foldable form, one part 229 of which is adhered to area 26 and the other part 231 is hinged from the first part for selective folding to and from the area 26. When folded onto area 26, the web part 231, being conductive through being a conductive metal or a nonconductive material with a conductor thereon, shunts the contact pads 8 together in the manner of the free form of the web, web 28.

Figure 7:
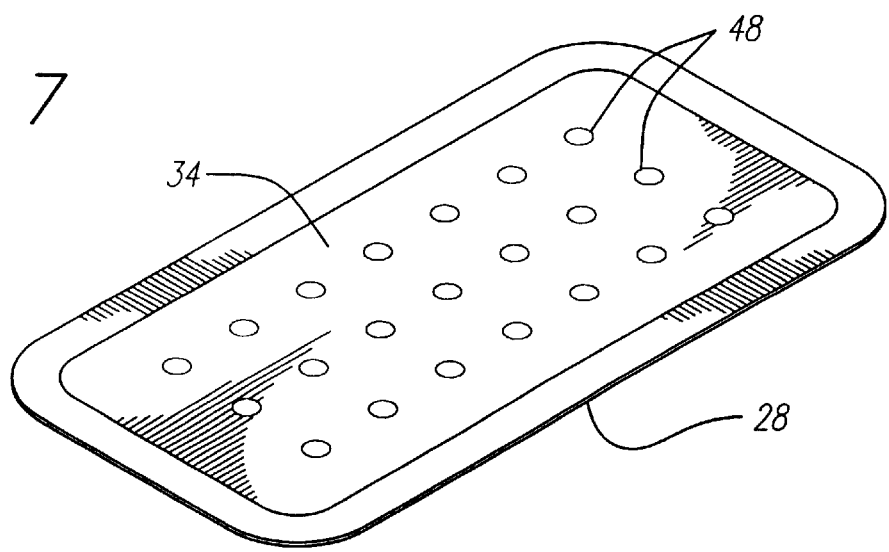
FIG. 7 is an oblique view of an alternate form of shunt structure.

In these various embodiments where the web 28, 128 or 228 is of conductive metal, the web carries the adhesive 32 as a continuous perimetrical deposit 42 as in FIG. 1C, as one or more spaced strip deposits 44 as in FIG. 4, or as separate, discrete quantities, such as separate, spaced apart dimples 46 of adhesive as shown in FIGS. 5A and 5B, or separate, spaced apart, flat spots 48 of adhesive as shown in FIG. 7 for separably adhering the web to the area 26.

Figure 11:
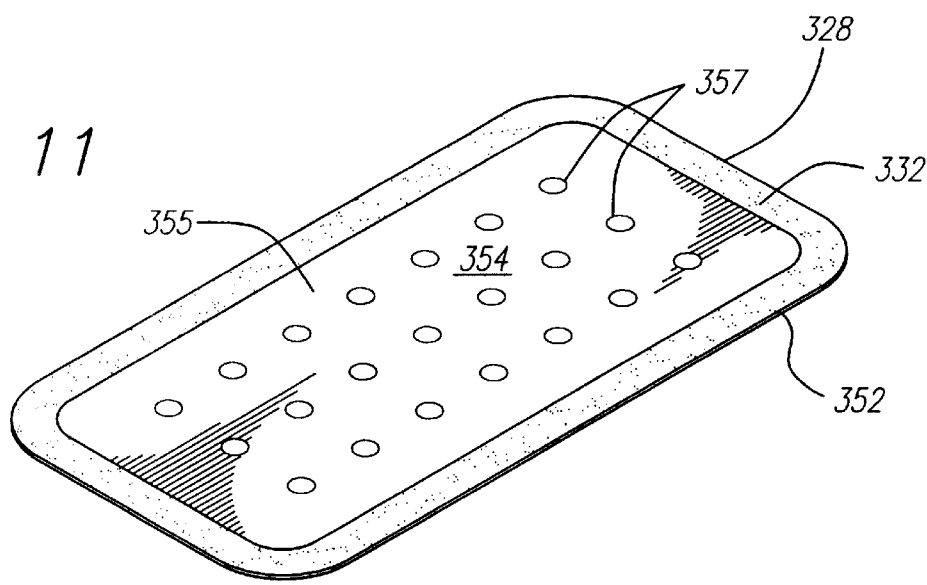
FIG. 11 is an oblique view of a further alternate form of the invention.

With reference now to FIGS. 6, 11, 12A and 12B, in FIG. 11 web 328 comprises a nonconductive plastic sheet material 352 having a conductive deposit of metal 354 thereon. The conductive metal deposit can be continuous or discontinuous across the web 328 e.g. like the form of perimetrical or strip adhesive deposits 42, 44 in FIG. 1C and FIG. 4, respectively, leaving space for adhesive 332 to be located. In FIG. 11 the conductive metal deposit 354 on web 328 comprises a laterally and longitudinally distributed series of flat spots 357 of conductive metal electrically connected to each other, e.g. formed from a common conductive metal sheet 355 and spaced so as to contact the conductor traces contact pads 8 in shunting relation. Perimetrically distributed adhesive 332 is used to adhere the web 328 in position.

Figure 6:
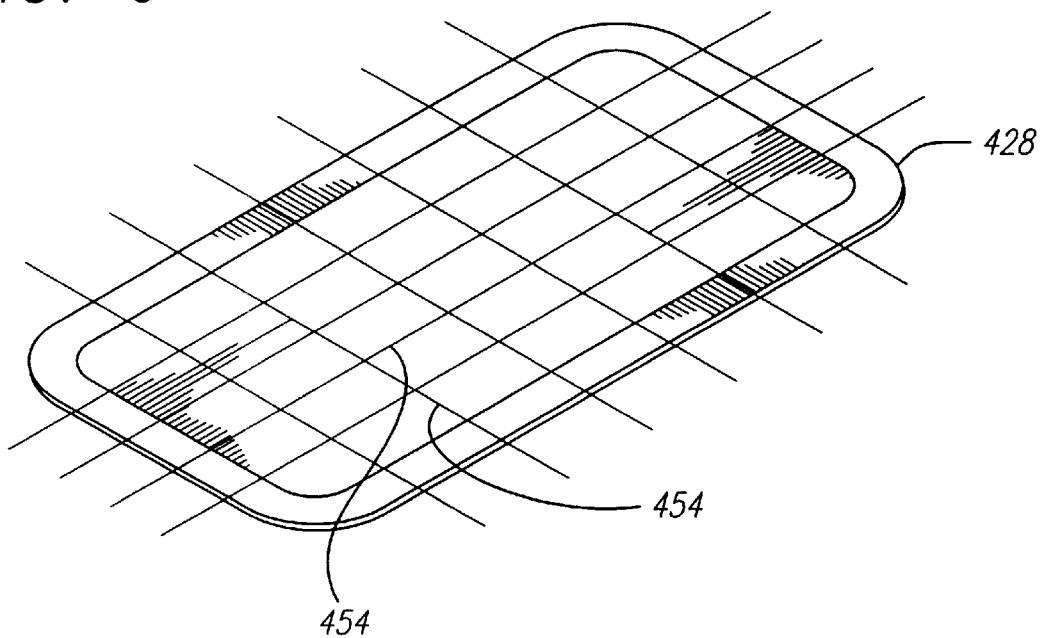
FIG. 6 is an oblique view of an alternate form of shunt structure.

In FIG. 6, the conductive metal deposit is in the form of a grid 454 formed in situ or separately formed in a manner to mount on the web 428.

Figure 12A:
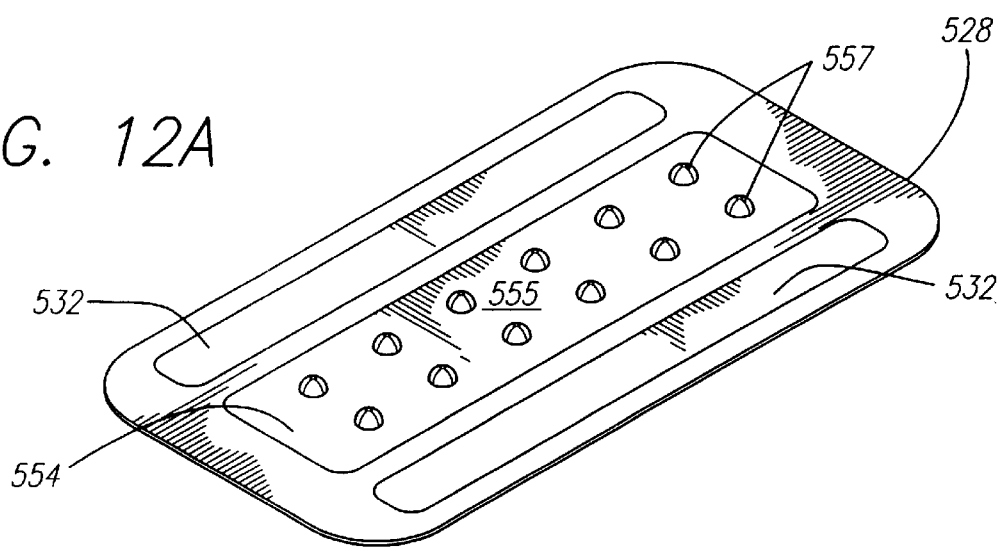
FIG. 12A is an oblique view of a further alternate form of the invention.
Figure 12B:
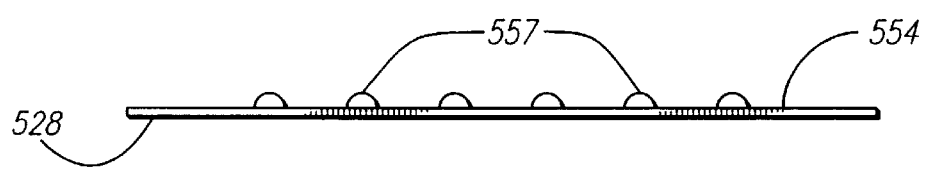
FIG. 12B is an end elevation view of the shunt structure shown in FIG. 12A

In FIGS. 12A and 12B, the conductive metal deposit 554 on web 528 comprises a laterally and longitudinally distributed series of dimples 557 of conductive metal electrically connected to each other, e.g. formed from a common conductive metal sheet 555 and spaced so as to contact the conductor traces contact pads 8 in shunting relation. Adhesive 532 on either side of the metal deposit 554 adheres the web 528 in place.

With reference to FIGS. 9A, 9B and 10, the assembly is as previously described except that in place of or in addition to the shunt structure 16 a separate shunt structure 716 is provided for maintaining the conductor traces 12A, 12B in a parallel, shunted condition whether or not the shunt structure 16 is in place (shunt structure 16 is typically removed during testing of the suspension S). For this purpose, invention provides a second series of contact pads 708, part of or electrically connected to the trace conductors 12A, 12B between the first series of contact pads 8 and the disk read head slider 9. The contact pads 708 comprise exposed portions of the trace conductors 12A, 12B or separate structures to be in electrical connection with the trace conductors. Shunt structure 716 is of one or more of the forms already described for shunt structure 16, and is applied to the second series of contact pads 708 as shunt structure 16 is applied to contact pads 8.

The invention thus provides for continuing shunt protection of wireless suspension assemblies shunt structure that is readily attached to and detached from the contact pads or other exposed areas of the conductive traces of the flexible conductive laminate portion of the wireless suspension for use as needed to protect the MR and GMR elements/heads. The shunt structure comprises a conductive web to connect the conductive traces in parallel, and adhesive allowing the separable attachment of the web to the traces. The metal or metal deposited conductive web has varying geometries of conductive areas and adhesive areas to allow conductive web attachment to the proximate contact pads of the suspension, to be removed during testing and left on during assembly and between tests to nearly continually protect the head magnetoresistive element, or, to provide continuous ESD protection for the MR and GMR element attached to a flexible conductive circuit, to allow conductive web attachment to the traces beyond the contact pads such that the web is left in place during suspension assembly, during testing and between tests. The foregoing objects are thus met.

We claim:

1. Disk drive suspension shunt structure for connecting in parallel a pair of trace conductors in a flexible conductive laminate connected to a disk read head, said trace conductors having exposed portions, said shunt structure comprising a flexible carrier, an adhesive carried on said carrier, said adhesive being separably adherent to said laminate, and a conductor material distributed across said carrier and relative to said adhesive such that said conductive element temporarily electrically connects in parallel said trace conductors at their exposed portions in the adhered condition of said carrier to said laminate.

2. A disk drive suspension comprising a load beam, a disk read head, a flexible conductive laminate comprising a plastic layer containing conductive traces electrically connected to said head in a manner potentially subjecting said head to spontaneous electrostatic discharge currents deleterious to said head, said trace conductors having adjacent exposed portions, and a shunt structure comprising a web adapted and arranged to temporarily electrically connect said laminate conductive traces at their said exposed portions, and an adhesive on said web separably bonding said shunt structure to said laminate in electrically connected relation with said conductive traces, whereby said discharge currents are directed away from said disk read head.

3. The disk drive suspension according to claim 2, in which said flexible conductive laminate comprises a dielectric plastic layer and one or more pairs of conductive traces supported by said dielectric plastic layer in insulated relation.

4. The disk drive suspension according to claim 2, in which said flexible conductive laminate comprises a base metal layer, a dielectric plastic layer and one or more pairs of conductive traces supported by said metal base layer and said dielectric plastic layer in insulated relation.

5. The disk drive suspension according to claim 2, in which said shunt structure web comprises a conductive metal sheet.

6. The disk drive suspension according to claim 5, in which said conductive metal sheet comprises a flexible sheet of copper, silver or gold.

7. The disk drive suspension according to claim 2, in which said adhesive is distributed across said web in separate, discrete quantities.

8. The disk drive suspension according to claim 7, in which said adhesive is formed into separated flat spots for separably adhering said web to said laminate.

9. The disk drive suspension according to claim 7, in which said adhesive is formed into separated dimples of adhesive for separably adhering said web to said laminate.

10. The disk drive suspension according to claim 2, in which said web comprises a nonconductive plastic sheet material having a conductive deposit of metal thereon.

11. The disk drive suspension according to claim 10, in which said conductive metal deposit is formed with raised portions for trace conductor contact.

12. The disk drive suspension according to claim 10, in which said conductive metal deposit is located in a predetermined location on said plastic sheet material, and in which areas of adhesive are formed adjacent said metal deposit for separably bonding said sheet material to said laminate with its conductive metal deposit in shunting conductive contact with said exposed trace conductor portions.

13. The disk drive suspension according to according to claim 12, in which said adhesive is formed into discrete dimples distributed across said conductive metal deposit for separably adhering said sheet to said laminate.

14. The disk drive suspension according to claim 12, in which said adhesive is formed into flat spots across said conductive metal deposit for separably adhering said sheet to said laminate.

15. The disk drive suspension according to claim 2, in which said shunt structure web comprises nonconductive sheet material, a conductor material distributively disposed on said web nonconductive sheet material, and an adhesive separably bondable to said laminate with said conductor material in conducting contact with said trace conductor portions.

16. The disk drive suspension according to claim 15, in which said nonconductive web comprises a plastic sheet material.

17. The disk drive suspension according to claim 16, in which said conductor material is distributed in a pattern across said plastic sheet material web and said adhesive is distributed in a further pattern across said plastic sheet material web for adhering said web to said laminate.

18. The disk drive suspension according to claim 17, in which said conductor material comprises a grid of conductor metal, said conductor metal grid being attached to said plastic sheet material, and said adhesive being arranged to separably bond said web to said laminate between the elements of said grid, said grid elements being in electrical contact with said trace conductor portions.

19. The disk drive suspension according to claim 17, in which said conductive material comprises a three dimensional sheet, said conductive material sheet being attached to said plastic sheet material, and said adhesive being arranged to separably bond said web to said laminate with said conductive material sheet in electrical contact with said trace conductor portions.

20. The disk drive suspension according to claim 19, in which there are a distributed series of raised areas on said conductive material sheet to provide said material sheet its said third dimension, said raised areas being arranged to make electrical contact with said trace conductor portions.

* * * * *